United States Patent [19]
Vichr et al.

[11] Patent Number: 5,753,038
[45] Date of Patent: May 19, 1998

[54] METHOD FOR THE GROWTH OF INDUSTRIAL CRYSTALS

[75] Inventors: Miroslav Vichr, Emmaus; David Samuel Hoover, New Tripoli, both of Pa.

[73] Assignee: Air Products and Chemicals, Inc., Allentown, Pa.

[21] Appl. No.: 821,484

[22] Filed: Mar. 21, 1997

Related U.S. Application Data

[60] Division of Ser. No. 454,775, May 31, 1995, Pat. No. 5,614,019, which is a continuation-in-part of Ser. No. 895,482, Jun. 8, 1992, Pat. No. 5,443,032.

[51] Int. Cl.⁶ .................................................. C30B 25/06
[52] U.S. Cl. ............................ 117/97; 117/84; 117/94; 117/95

[58] Field of Search .............................. 117/84, 94, 95, 117/97

Primary Examiner—Felisa Garrett
Attorney, Agent, or Firm—Keith D. Gourley

[57] ABSTRACT

A method is disclosed for producing large single crystals. According to the initial steps of this method, a plurality of single crystal wafers are crystallographically oriented to form a seed plate which is patterned. The patterned seed plate is selectively etched to expose the bare surface of the seed plate. The exposed, patterned bare surface of the seed plate is etched to form a plurality of nucleation structures. Each of the nucleation structures protrude outwardly from the underlying surface of the seed plate and provide ideal structures for the growth of large, single crystals. The resulting large, single crystals can be separated from the seed crystals by etching, physical or chemical means.

30 Claims, 6 Drawing Sheets

METHOD FOR THE GROWTH OF INDUSTRIAL CRYSTALS

RELATED U.S. APPLICATION DATA

This is a division, of application Ser. No. 08/454,775, filed 31 May 1995, now U.S. Pat. No. 5,614,019 which is a Continuation-in-Part of patent U.S. application Ser. No. 07/895,482, now U.S. Pat No. 5,443,032 filed Jun. 8, 1992, the specifications and claims which are incorporated by reference.

FIELD OF THE INVENTION

This invention relates to an alternative method to the method described in parent application Ser. No. 07/895,482 for the manufacture of large single crystals of diamond, cubic boron nitride, silicon carbide and similar crystals which are difficult to manufacture in large dimensions. More particularly, the invention relates to a method for preparing seed plates for use in growing large, single crystals and a method for producing single crystal, electronic grade diamond wafers larger than single crystal diamond wafers that are currently available, i.e. areas greater than about 1 centimeter$^2$ (cm$^2$).

BACKGROUND OF THE INVENTION

Graphite is the most stable form of carbon under normal conditions, but at pressures of approximately 600,000 atmospheres and temperatures exceeding 1500° C., diamond is the thermodynamically stable phase. General Electric succeeded in growing synthetic diamond in the metastable region during the early 1950's by dissolving carbon in a molten transition metal at pressures in the range of about 40,000 to about 60,000 atmospheres and temperatures in the range of about 1200 to about 1600° C., i.e., high pressure, high temperature (HPHT) conditions, see H. T. Hall et al., U.S. Pat. No. 2,947,610. Diamond crystals nucleate and grow from molten carbon and metal solution, typically a nickel or iron solution. While most of the diamond crystals produced by HPHT conditions are under one millimeter (mm) for diamond grit applications, several corporations have been able to produce diamond crystals almost up to one cm. Due to the enormous difficulties with scaling up the pressure in large volumes at high temperature and difficulties with preserving the integrity of seals, only very moderate improvements in the size of diamond single crystals by the HPHT technique beyond one cm can be expected in the future.

The ideal solution for the needs of the electronic industry would be hetero-epitaxial diamond on inexpensive substrates. Diamond via hetero-epitaxial chemical vapor deposition (CVD) has been reported on mm size cubic-boron nitride (C-BN) single crystal made by HPHT; see M. Yoshikawa et al., *Appl.Phys.Lett.*, Vol. 57, page 428 (1990). C-BN shows the most promise as a heteroepitaxial substrate for diamond due to similar structure, close lattice match and high surface energy. Unfortunately, only about 1 mm size crystal of cubic BN is available from HPHT techniques as of this date and the preparation of large single crystal cubic BN substrates from gas phase is very difficult and has not as yet been accomplished.

An interesting technique has been disclosed which utilizes an array of 100 µm (0.1 mm) octahedron faceted HPHT diamond crystals fitted by spinning from a slurry into corresponding pyramidal etch pits onto a silicon wafer; see N. V. Geis et al., *Proceedings of the Second International Symposium on Diamond Materials*, 179th Meeting of the Electrochemical Society in Washington, D.C., page 605, May 5, 1991. In this technique, commercially available (111)-faceted diamond seeds having diameters of 75 to 100 µm are deposited on (100)-oriented Si substrates which had been patterned and etched using standard photolithographic methods to form 90 µm square etch pits on 100 µm centers faceted on (111)-planes. Homoepitaxial diamond is grown on the diamond seeds to form a continuous diamond film composed of a plurality of approximately oriented small crystals. Self supporting continuous diamond films were obtained after etching away the silicon substrate. The diamond film contains low angle grain boundaries because diamond seeds are always misoriented by a few degrees. Textured growth on silicon or beta silicon carbide has much smaller diamond grain size on the order of a few microns across the single crystal grain, but the misorientation of individual grains is on the same order of magnitude in both cases.

The disadvantages of the foregoing technique are that default holes occur in the resulting diamond film as a result of missing seed crystals in some of the etch pits and that a slight misorientation occurs among the individual single crystal grains. Therefore, this prior art technique does not produce a crystallographically perfect single crystal.

The method of the present copending parent application, U.S. Ser. No. 07/895,482 is directed to CVD diamond growth on a plurality of oriented single crystal diamond seed wafers which are patterned with a plurality of seed holes formed in such a way that newly grown single crystal diamond layer can be separated from a reusable diamond substrate. As a consequence of the orientation of two or more precisely oriented single crystal diamond patterned structures, a large diamond single crystal seed plate is generated by epitaxial fusion.

R. A. Rudder et al., has succeeded in depositing diamonds onto a photolithographically defined large electronic device area and has observed isotropic overgrowth advancing vertically and horizontally by about the same rate; see R. A. Rudder, J. B. Posthill, G. C. Hudson, D. Malta, R. E. Thomas, R. J. Markunas, T. P. Humphreys, R. J. Nemanich, *Proceedings of the Second International Conference New Diamond Science and Technology*, Washington, D.C., page 425, Sep. 23–27, 1990. The Rudder et al. method includes the steps of depositing polycrystalline silicon onto a single diamond substrate; depositing a masking layer onto the Si layer; photolithographically opening holes to allow for the homoepitaxial diamond to nucleate; and depositing diamond onto the resulting substrate by CVD to form overgrowth extending over the Si pattern.

The preceding reference does riot teach separating the resultant deposited diamond layer from the substrate by any means such as mechanical, physical or cutting means. The reference also fails to teach growing a continuous monocrystalline (i.e., a single crystal) layer of material onto a substrate and then separating that material from the substrate. The quality of homoepitaxially grown diamond above the holes in the masking layer on the device was claimed to be superior to the quality of underlying diamond substrate; see J. B. Posthill, R. A. Rudder, G. C. Hudson, D. P. Malta, G. C. Fountain, R. E. Thomas, R. J. Markunas, T. P. Humphreys, R. J. Nemanich, *Proceedings of the Second International Symposium on Diamond Materials*, Proceedings Vol. 91–8 of the Electrochemical Society, May 5–10, 1991, page 274, Washington, D.C.

The superior quality of a laterally propagated epitaxial layer is believed to be due to the so called "necking effect", which is frequently used in Bridgman or Czochralski crystal growth. Necking down the growing crystal limits the propagation of dislocation from the seed crystal only to the straight direction of growth, but not in lateral directions. In the references mentioned above, R. A. Rudder and J. B. Posthill have demonstrated that the same effect of lateral overgrowth which is being used successfully in silicon and gallium arsenide microelectronics for the fabrication of three dimensional integrated circuits can be used to fabricate three dimensional integrated circuits in diamond microelectronics technology. The reference does not teach using this technology to grow large monocrystalline diamond plates.

Anthony et al., U.S. Pat. No. 5,264,071, teach a chemical vapor deposition (CVD) method for making a monolithic polycrystalline (i.e., multiple crystals) diamond sheet in which a diamond is deposited onto a non-diamond substrate which is smooth and free of surface irregularities to reduce physical bonding between such irregularities to the deposited polycrystalline CVD diamond. The polycrystalline diamond sheet is separated from the substrate by a cooling step or by dissolving the entire substrate after the deposition to facilitate the release of the diamond sheet from the polished, metallic substrate.

The electronic industry is using large semiconductor single crystal wafers ranging in size from 5 cm to 20 cm in diameter. Wafers smaller than 5 cm in diameter currently cannot be economically produced. Therefore, for the electronic industry desires free-standing single crystal diamond wafers which are larger than 5 cm in diameter, so that the electronic industry can take advantage of the outstanding electronic properties of diamond. In order to take full advantage of diamond's outstanding electronic properties, diamond large free-standing single crystal wafers must be true single crystals which do not possess large angle grain boundaries and should be at least comparable in quality to the best natural diamond single crystal. Polycrystalline diamond films which deviate from the ideal orientation of single crystal by as little as 0.2 degree will display inferior electronic properties by the virtue of the presence of large angle grain boundaries. Large angle grain boundaries cause impurities to segregate on the interface between the grains and display an undesirable concentration of structural defects and electrical defects. These textured quasi-epitaxial diamond films or crystalline diamond structures demonstrate inferior electrical properties.

SUMMARY OF THE INVENTION

In contrast to the techniques disclosed in the prior art, the present invention is capable of generating large single crystals having high monocrystalline perfection which can be used in electronic, optical, mechanical and other applications. This result is accomplished by producing a highly perfect free-standing single crystal diamond wafer which is comprised primarily of low angle grain boundaries.

According to the initial steps of this method, a plurality of substrate surfaces or single crystal wafers are crystallographically oriented to form a seed plate. The seed plate is patterned by depositing a patterned masking layer. The patterned seed plate is selectively etched to expose the bare surface of the seed plate. The exposed, patterned bare surface of the seed plate is etched to form a plurality of nucleation structures consisting of the seed plate material and the remaining portion of the masking layer. Each of the nucleation structures protrude outwardly from the underlying surface of the seed plate and provide ideal structures for single crystal growth. Each of the nucleation structures comprises walls and a top surface having an area in the range of about 5 to about 90% of the surface area of the original seed plate. More particularly, each nucleation structure comprises a protrusion mesa having side walls and a geometrically patterned top surface having a surface area in the range of about 0.2 to about 60 $\mu m^2$.

The geometric pattern can possess any shape including a triangle or circle, and the preferred pattern is a square. The seed plate is recovered and any remaining masking layer material is removed from the top surfaces of the protrusion mesas. The seed plate can then be placed into a crystal growing reactor and epitaxial crystals are grown onto the top surfaces of the mesas and above the spaces between the top surfaces of the mesas above the underlying substrate. A continuous layer of monocrystalline material is formed over a period of time to achieve a thickness in the range of about 1 $\mu m$ to about 1 cm. A thickness in the range of about 50 $\mu m$ to about 1,000 $\mu m$ is preferred.

In one embodiment of the method of the present invention, the growth of the monocrystalline material initially proceeds with approximately the same growth rate on the top surfaces and the side walls of the mesas as well as the underlying surface of the seed plate. In this embodiment, a series of interconnecting channels are created within the monocrystalline material, i.e., between the growth of monocrystalline material on the side walls of the mesas and the underlying surface of the seed plate and below the monocrystalline material overlying the spaces between the top surfaces of the mesas. When the gaps between the top surfaces of the mesas have been closed, a continuous layer of the monocrystalline material continues to grow on such top surfaces and on the closed gaps between the top surfaces. There are a number of methods to modify the seed plate so that most of the subsequent single crystal growth is deposited on the top surfaces of the mesas and on the closed gaps. Such methods should prevent or slow down the single crystal growth anywhere else on the side walls of the mesas and prevent or slow down single crystal growth on the substrate underlying these open spaces.

During the initial steps of another embodiment of the present invention, the etching step forms mesas to insure that the side walls are substantially straight, i.e., the side walls are substantially normal to the horizontal plane of the seed plate. This structure is obtained by impinging an oxidizing beam substantially normal to the horizontal plane of the substrate. The top surfaces of the resulting seed plate recovered from this embodiment are deposited with a relatively thick layer of a masking or coating material having a thickness ranging from about 5 $\mu m$ to about 30 $\mu m$. This can be accomplished by depositing a suitable coating material onto the entire surface of the substrate.

Suitable coating materials include soft carbon, carbon soot, graphite, diamond-like carbon, hydrogenated diamond-like carbon, graphite, submicron-sized metal powder, aliphatic epoxy polymers, and mixtures thereof. Initially, the coating material covers the entire surfaces including the side walls and the top surfaces of the nucleation structures and the underlying substrate. The resulting masked seed plate is planerized by polishing so that only the top surfaces of the mesas are uncovered, but the spaces between the mesas are protected by the masking layer. The top surfaces of bare mesas function as single crystal nuclei for the initiation of crystalline growth. After the termination of the crystalline growth cycle, the newly grown single crystal is separated from the diamond substrate by any etching, mechanical or chemical means.

In a variation of the above embodiment of the present invention, the top surfaces of the seed plate are deposited with a relatively thick layer of a graphite material. This can be done by the steps of spinning an emulsion of graphite or other easily combustible coating material on the top of the mesas and drying the emulsion. Alternatively, the step of spinning can be replaced by the step of dipping the mesas in the emulsion. These steps of spinning or dipping and drying are repeated several times until a build up of graphite exists to completely cover the side walls and the top surfaces of the mesas and the underlying substrate.

In this embodiment, the resulting completely masked seed plate is also planerized by polishing to uncover the top surface of the mesas and to leave the rest of the seed plate protected by porous, dried graphite. The resulting masked seed plate, with only the top surfaces of the mesas free of graphite, is placed on a suitable wafer holder in a CVD reactor. In this embodiment, the resultant fully grown epitaxial crystal is separated from the seed plate by etching or burning out the remainder of the graphite material and etching or burning through the cross-sectional areas of the mesas of the seed plate between the underlying surface and the top surface of mesas. Specifically, the composite is subjected to an oxidizing atmosphere at temperatures in the range of about 650° to about 1000° C. for a sufficient period of time to etch through about cross-sectional areas of the mesas connecting the newly grown single crystal with the underlying substrate until separation occurs. The single crystal recovered from this process has an area that is greater than each of the plurality of crystal wafers that comprise the seed plate.

During the initial steps of still another embodiment of the present invention, the etching step forms each of the plurality of mesas in the shape of an inverted pyramid with the base of pyramid being the top surface of the mesa and the apex being attached to the underlying substrate. This is done, for example, by impinging an oxidizing beam at an angle of substantially less than 90° from the normal plane of the single crystal diamond substrate while the substrate is being rotated. Preferably the oxidizing beam is directed at an angle in the range of about 15° to about 55° from the normal, and still more preferably at an angle in the range of about 17° to about 45°.

The resulting patterned seed plate is place in a CVD reactor for the diamond growth step. Diamond deposits on the inverted pyramidal mesas in such a way the diamond growth bridges the narrow gaps between the mesas at the tops of the mesas. In this way a continuous single crystal diamond layer at the top of the patterned surface is formed. A network of empty tunnels is left below this single crystal diamond growth layer. Therefore after the termination of the crystal growth cycle, the newly grown single crystal can easily be separated from the substrate by etching in an oxidizing atmosphere due to the presence of the empty tunnels. Specifically, the composite is subjected to an oxidizing atmosphere at temperatures in the range of about 650° to about 1000° C. for a sufficient period of time to etch through the thinnest cross-sectional areas of the pyramidal mesas between the apex and the base connecting the newly grown single crystal with the underlying surface of the original substrate until separation occurs.

The resulting single crystal can then be used as the seed plate in place of the plurality of smaller crystal wafers used in the initial steps of the method and the remaining steps of crystal growing, separation and recovery are repeated.

BRIEF DESCRIPTION OF THE DRAWINGS

Further features and advantages of the method disclosed herein will become apparent from the following and more particular description of the preferred embodiment of the invention as illustrated in the accompanying drawings (not to scale), in which.

DETAILED DESCRIPTION OF THE INVENTION

Figure 1:
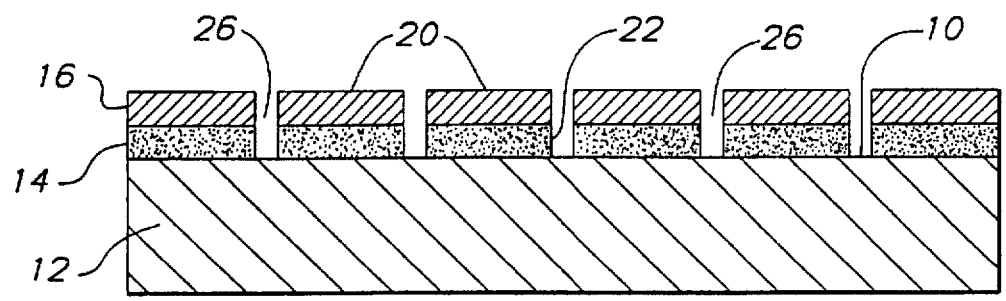
FIGS. 1–6 (the proportions in these figures are distorted to more clearly illustrate critical features) are schematic illustrations of the step-by-step fabrication of a diamond single crystal in accordance with one embodiment of the present invention.

As shown in FIG. 1, planar face 10 of substrate 12, which has been masked with a masking layer 14 and a photoresist layer 16, is patterned with a plurality, i.e., about $10^5$ to about $10^8/cm^2$, of evenly distributed photoresist mesas 20 by standard photolithographical procedures. Such procedures are used to define photoresist mesas 20, for example, of square shape, placed in a rectangular periodic array with the squares in the range of about 3×3 µm large separated by about 1 µm gaps. The shape of these mesas can be square, circular, hexagonal or any other geometric shapes which allows for a higher density packing because it allows for a higher density of patterned features per unity of surface. Reactive ion etching is used to open gaps in masking layer 14 by a standard conventional procedure. After etching, surface 10 of substrate 12 possesses an array of masking layer mesas 22 capped with photoresist mesas 20 separated by opened channels 26 free of masking layer 14 and bare substrate 12 is exposed at the bottom of channels 26. For example, channels 26 are on the order of about 1 µm wide.

The masking layer can comprise any material which is chemically compatible with the substrate such as metals, metal and other inorganic oxides, and ceramics. Specific examples of such materials include: silicon, tungsten, molybdenum, nickel, gold, copper, soft carbon, diamond-like carbon, hydrogenated diamond-like carbon, $SiO_2$, $Si_3N_4$, MgO, CaO, silicon oxynitride and mixtures thereof.

Figure 2:
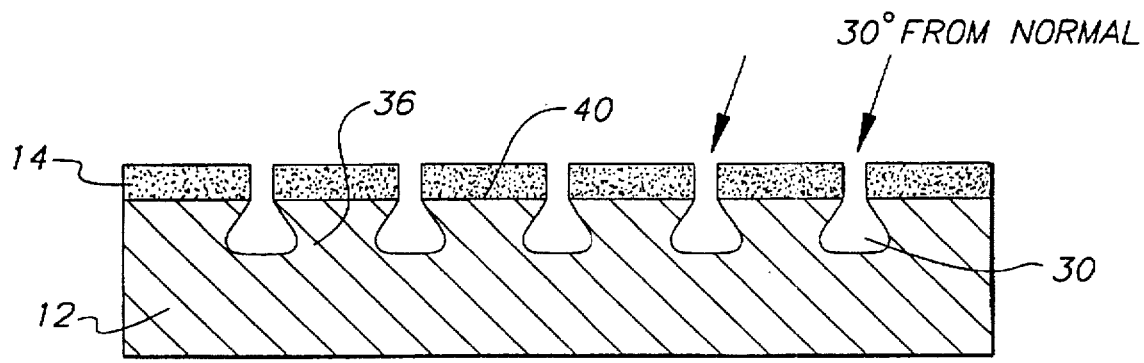

FIG. 2 shows the patterned surface of substrate 12 after being subjected to an etching step by a directional ion beam of an oxidizing gas generated by an ion milling machine. For example, the ion beam is set to impinge on the plane of substrate 12 at about a 30° angle from the normal plane of substrate 12. Substrate 12 is held by a holder which rotates the substrate 12 at, for example, about 1 rpm. In this manner, the diamond substrate is removed from the bottoms of channels 26 in such a way that deeper channels 30 are created in underlying substrate 12. The ion beam is also undercutting masking layer 14 mesas on top surface 32 approximately at the same angle of the impinging ion beam all around square mesas 22.

Figure 3:
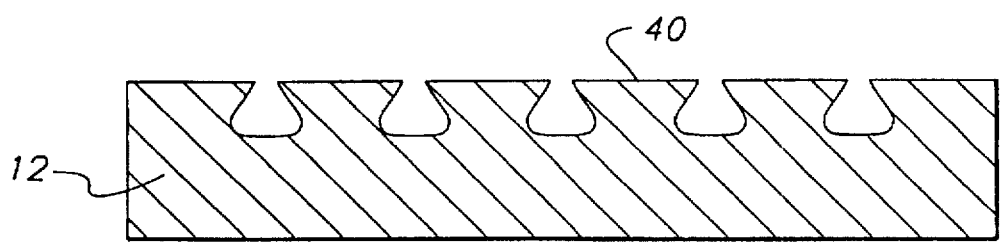
Figure 2A:
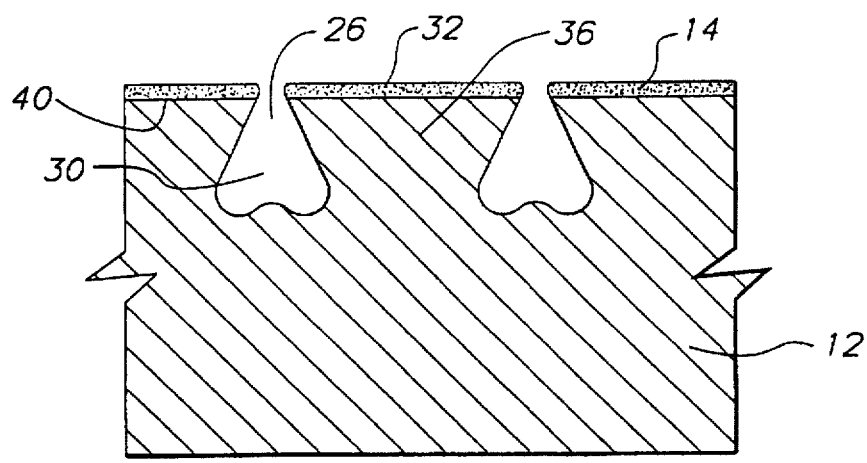
FIG. 2a (the proportions in this figure are distorted to more clearly illustrate critical features) is an enlargement of one of the mesas on the seed plate shown in FIG. 2.

For example, the depth of channels 30 after etching is approximately six μm and the width at approximately the bottom of channels 30 in substrate 12 is about three μm. The shape of the newly created mesas 36 approximates an inverted tetragonal pyramid where the base 40 of the pyramid is the original masking layer square mesa 22 on the top surface of substrate 12 and the narrow part or apex of the pyramid approximately 1 μm wide is connected to the seed plate on the opposite end of the pyramid base. FIG. 2a more clearly shows one such mesa 36. Any remaining photoresist mesa caps 20 remaining on the top of mesas 22 are etched away by the action of an ion beam at the same time with substrate etching. FIG. 3 shows that masking layer mesas 22 of base 40 have been etched away with a suitable chemical agent such as an acid or by dry etching.

As shown in FIG. 3, substrate 12 has nucleation structures 36 which exhibit precisely oriented single crystal nuclei having a density of nuclei of, for example, approximately $6.25 \times 10^6 cm^{-2}$. Therefore, substrate 12 is ideal as a single crystal diamond seed plate for single crystal diamond growth by a CVD technique.

Figure 4A:
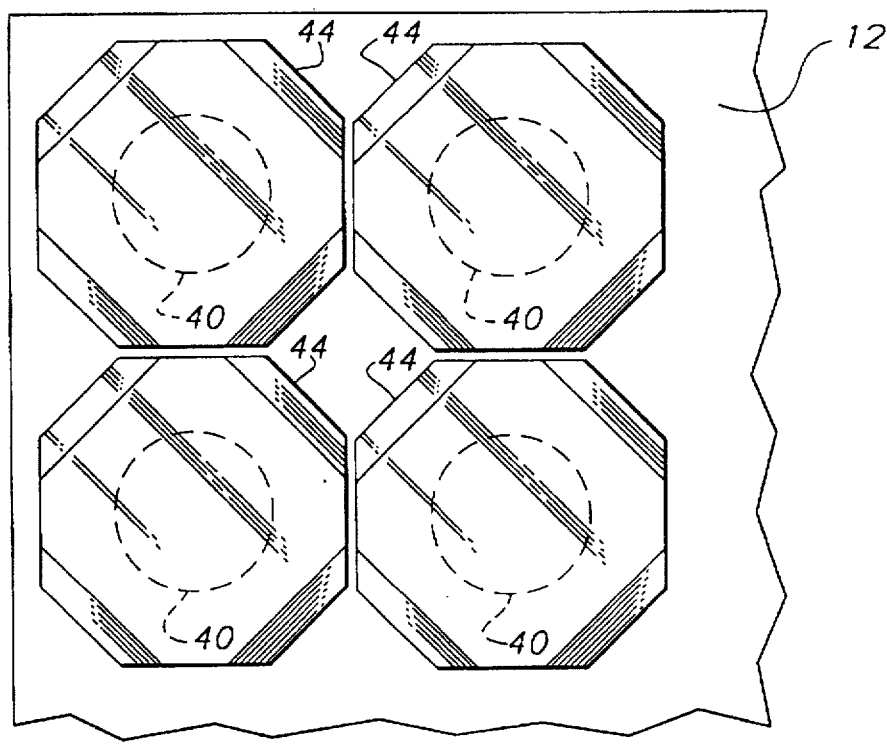
FIG. 4a is a top plan view of one corner of the seed plate 12, as schematically illustrated in FIG. 4, showing the growth on the mesas of regular diamond crystal with octagonal cross-section before the crystals become fused into a single crystal.
Figure 4B:
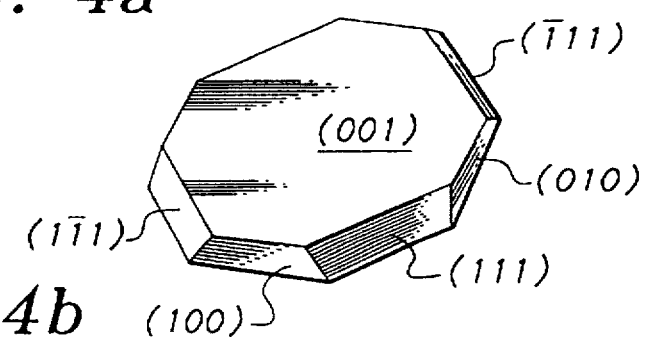
FIG. 4b is an oblique pictorial view of the upper portion of an individual diamond nucleus that forms on the mesas as schematically illustrated in FIG. 4.
Figure 4:
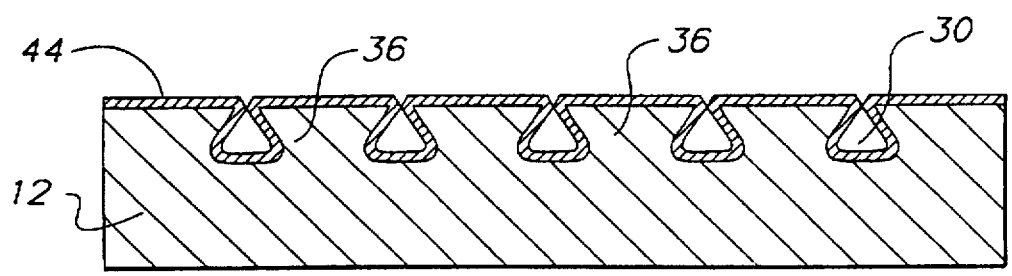
Figure 5:
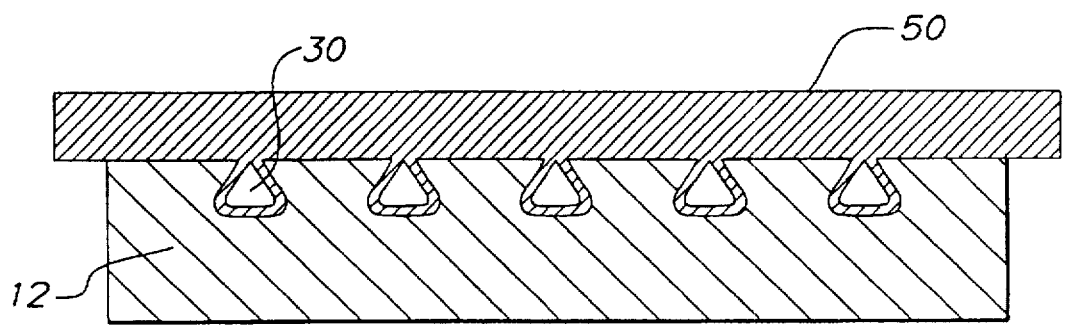

FIG. 4 shows the structure obtained following the first period of crystal growth on the surface of the underlying plate 12 and the nucleation structures consisting of bases 40 and the sides of pyramidal mesas 22. As the growth process continues, the epitaxial diamond crystal 44 grows laterally and vertically over channels 30 and covers the entire region above substrate 12 as shown in FIGS. 4, 4a and 5 and is separated by channels 30 from original plate 12. Specifically, in the case of diamond growth on a (100) diamond substrate, the top part of one of the individual diamond nuclei is illustrated by FIG. 4b in which each of the facets is identified. FIG. 4b shows that the individual crystals are limited by (100) and (111) crystallographical faces of high perfection during the first period of growth.

Figure 6:
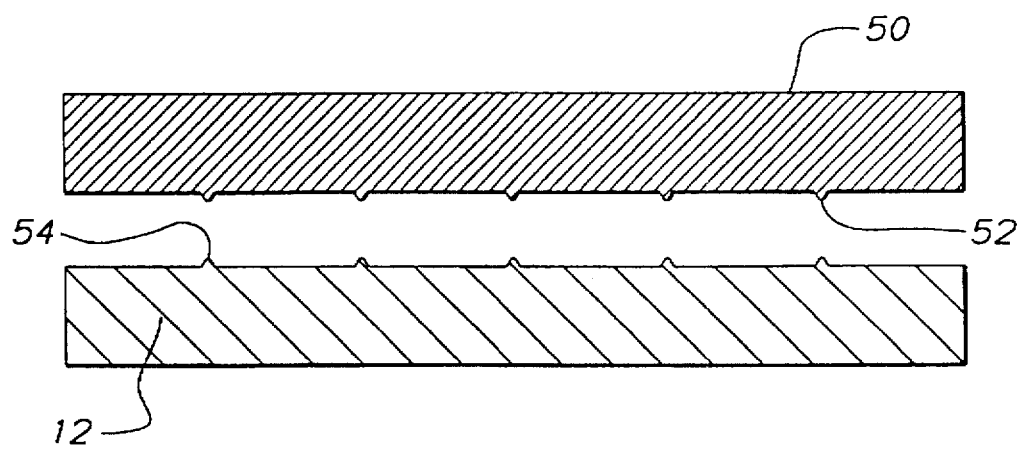

After the small diamond nuclei coalesce into a single crystal diamond layer 50 and the diamond layer reaches the desired thickness for the application (4 μm to 1 mm, or more), as shown in FIG. 5, the growth process is stopped and single crystal diamond layer 50 is separated from the diamond seed plate 12 into a freestanding diamond wafer, as shown in FIG. 6, by mechanical, chemical, or other means. For example, separation can be accomplished by etching, laser cutting, cleaving, thermal shock in a temperature gradient and other similar methods. In the case of separation by air at 750° C., diamond crystal mesas 36 are etched through to separate crystal 50 containing upper protrusions 52 from the original seed plate 12 containing the lower protrusions 54. Upper and lower protrusions 52 and 54, that remain after the etching through mesas 36, can be removed by polishing.

Original single crystal diamond seed plate 12 is recovered after the separation process is finished and can be regrown by a subsequent CVD process to the original thickness, repolished and reused again for the fabrication of an artificial diamond nucleation structure for another cycle of single crystal diamond fabrication. Alternatively, the original diamond substrate can be repolished after separation and used again for the fabrication of an artificial diamond single crystal nucleation structure several times without regrowing it. However, once the diamond substrate gets too thin for mechanical handling, the thickness must be restored by CVD single crystal diamond growth to its original thickness. This process can be repeated many times in order to manufacture a desirable amount of new diamond single crystals.

Figure 7:
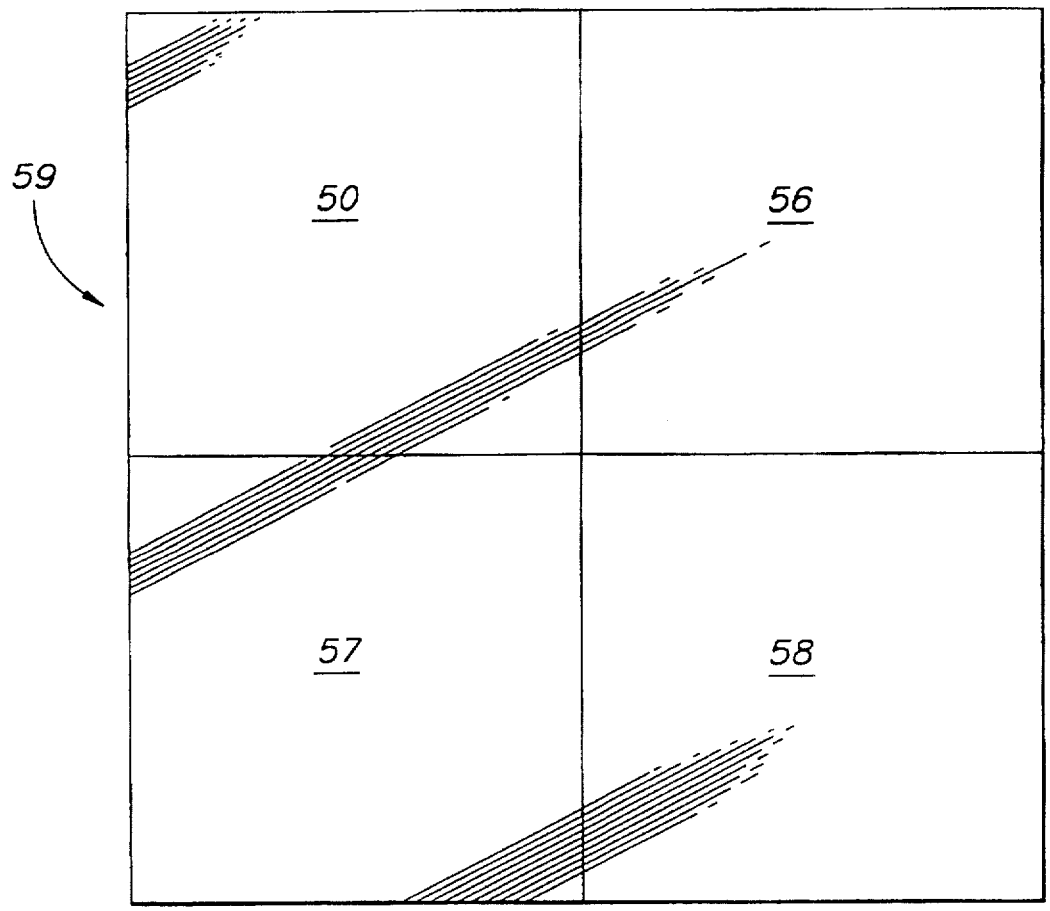
FIG. 7 and FIG. 8 (the proportions in FIG. 8 are distorted to more clearly illustrate critical features) are schematic illustrations of two of the essential steps in the fabrication of a large single diamond crystal according to the method of the present invention.
Figure 8:
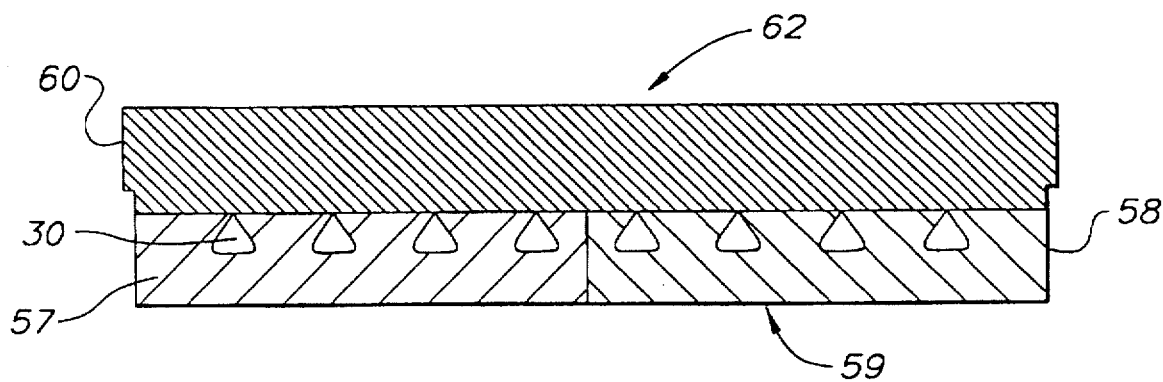

Large diamond crystal wafers are generated by precise alignment of several small crystallographically oriented diamond crystal wafers to form larger seed plates and subsequent diamond growth on the nucleation structures until the desired size of diamond free-standing wafer is achieved. Methods for achieving precise alignment of the crystal wafers are well known in the art. FIG. 7 illustrates the assembly of four of these single diamond crystals, 50, 56, 57 and 58, to form square seed plate 59. However, the exact number of separate crystal-wafers that are operably positioned to form the seed plate comprising the plurality of crystal wafers is not critical and will depend on the particular size of the final crystal product. Seed plate 59 as shown in FIG. 8 after being patterned masked by photolithographic procedures and etched in the same manner as the individual crystal wafers and seed plate 59 containing the channels 30, is placed in a crystal growing reactor to grow large epitaxial diamond crystal 60 on seed plate 59 to form composite 62. Crystal 60 can be grown to sufficient thickness to be freestanding or to a thin crystal epitaxial layer which can be supported by an additional layer of material for the separation.

During the embodiment of the present invention which is illustrated in FIGS. 9–15 and set forth in detail in Example 1, a masking layer is used comprising graphite, soft carbon, soot, diamond-like carbon, pyrolyzed polymers and similar carbonaceous materials which are easily combusted. The epitaxially grown crystal layer is separated from the seed plate by etching the masking layer at temperatures in the range of about 250° to about 600° C. in the presence of an oxygen-containing atmosphere and raising the temperature in the range of about 600° to about 900° C. to etch away the diamond mesas.

The commercially important feature of the present invention is that after the large, epitaxially grown crystal layer is separated from the seed plate, the resulting separated large crystal can be used to produce additional single crystals. Once an inventory of seed plates of varying lengths and widths ranging in area from about 2 to about 40 cm² has been manufactured, the seed plates are patterned masked and placed directly into the crystal growing reactor for replication of single crystals of substantially the same area.

The method of the present invention produces large crystals using small crystal starting materials, i.e., the seed plate, such as natural and HPHT synthetic diamond crystals which are available in sizes up to about 1 cm². This process can be used to produce a variety of important crystals which are available only in small crystal sizes which can be used as the seed crystals for the present method. Such materials include silicon carbide and C-BN and similar crystals which are difficult to manufacture in large dimensions.

Diamond growth for the purpose of this invention can be accomplished by any technique capable of growing diamond epitaxial layers, which is not detrimental to the masking layer. The exact crystal growing techniques that are used to grow the large crystals by the present method are not critical. The following list of techniques is illustrative, but not exhaustive: hot filament CVD (HFCVD), microwave-assisted CVD, radio frequency plasma CVD (RFCVD), DC plasma assisted CVD, electron assisted CVD, Electron Cyclotron Resonance (ECR) plasma CVD, DC or AC arc plasma jet, and combustion flame diamond growth deposition. The following references provide an illustration of the state of the art of such techniques: U.S. Pat. No. 4,767,608; 4,740,263; 4,734,339 and 4,707,384.

One of the most frequently used chemical compounds for diamond growth is methane (0.1–7% vol.) with hydrogen gas making up the balance. Methane can be replaced with a variety of other compounds containing carbon, hydrogen, halogen, and sometimes oxygen. The following hydrocarbons have been successfully used: methane, ethane, propane, acetylene, ethene and benzene. The use of organic compounds such as methyl alcohol, ethyl alcohol, acetone, acetic acid typically results in faster diamond growth rates. Halogens or halocarbons based mixtures with hydrocarbons or alcohols and small oxygen addition allow growth of diamond crystal at lower temperatures. A carbon monoxide mixture (e.g. 15% by volume) with hydrogen is also known to result in good quality diamond growth. Oxygen and water are sometimes added to carbon-containing mixtures in order to modify the character of crystal growth. Inert gases are also sometimes added to reaction mixture.

The purity of gases is critical for electronic applications in respect to species that become incorporated in the diamond crystal and are either electrically active or result in formation of inclusions. An example of an undesirable impurity is nitrogen. On the other hand, electrically active impurities are sometimes deliberately added in order to render the diamond crystal electrically conductive. Examples of such desirable impurities include diborane or some other boron compounds, which make diamond a p-type conductor.

Suitable temperatures for conducting the growth step can be chosen from 350° to 1250° C. The preferred temperature range for HFCVD with 1% methane and 99% hydrogen is 600°–1050° C. at 30 Torr pressure in the reactor. The gas mixture pressure depends on the particular technique used. Typical pressure for the HFCVD technique ranges between 20–80 Torr. The range of gas pressure is from low pressures, i.e. 0.5 Torr which is sometimes used in RFCVD, to 1 atm., which is sometimes used in the DC arc jet technique. The flow rate of the gas mixture depends on the specific crystal growing technique used and the size of the crystal growing reactor. Gas flow rates for a 5 cm diameter HFCVD reactor range from 1 cm$^3$/min. to 100 cm$^3$/min., preferably in the range 5 cm$^3$/min. to 15 cm$^3$/min.

The masking layer can be deposited onto the diamond seed by a number of techniques routinely used in the semiconductor industry such as evaporation, sputtering, ion beam deposition, CVD and the like. Patterning of the masking layer can be done by standard photolithographical techniques routinely used for manufacturing devices in semiconductor industry. A photolithographical mask is typically designed which allows for printing a design on the photoresist, spun off on a masking layer on the top of diamond seed. The design consists of circles or squares or other geometrical figures with dimensions from 0.1 μm–10 μm separated by distance of 0.5–20.0 μm on a rectangular, hexagonal or other grid pattern. The thickness of the masking layer typically ranges from 0.01 μm to 5 μm with the preferred range from 0.1 μm–2 μm.

In the preferred embodiment of the present invention, HFCVD and microwave-assisted CVD reactors have been used to manufacture large single diamond crystals. A general description of the type of HFCVD reactors and the process conditions suitable for depositing such diamond crystals via HFCVD are set forth in U.S. Pat. No. 5,126,206, issued Jun. 30, 1992. A general description of the type of microwave-assisted CVD reactors and the process conditions suitable for depositing such diamond crystals via microwave-assisted CVD are set forth in A. R. Badzian, T. Badzian, R. Roy, R. Messier, K. E. Spear, "*Crystallization of Diamond Crystals and Films By Microwave-Assisted CVD [II]*", Mat. Res. Bulletin, Vol. 23, pages 531–548 (1988).

The following examples are provided to further illustrate Applicants' invention. Example 1 which follows describes another embodiment of the method of the invention which is illustrated in FIGS. 9–15.

EXAMPLE 1

MANUFACTURE OF FREE STANDING SINGLE CRYSTAL DIAMOND USING A NUCLEATION STRUCTURE HAVING CYLINDRICAL MEAS NUCLEI

Natural II.A type diamond single crystal square substrate of (100) orientation and 8 mm×8 mm×0.25 mm dimensions was used as seed plate 70 for crystal growth. The diamond seed plate was cleaned with organic solvents by rinsing 2 min. in trichloroethane, 2 min. in acetone, 2 min. in ethyl alcohol and 5 min. in deionized water, and blown dry with nitrogen gas. Next, the wafer was placed in ion beam sputtering machine in order to deposit on its polished surface, 0.5 μm of silicon dioxide. After pulling a vacuum of 5×10$^{-6}$ Torr, the diamond substrate was precleaned with an argon ion beam generated from an 11 cm diameter Kaufman source at 500 eV and 137 mA for 1 min.

Figure 9:
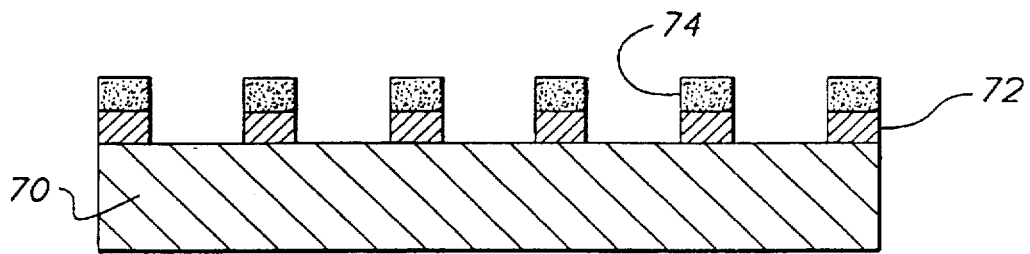
FIGS. 9–15 (the proportions in these figures are distorted to more clearly illustrate critical features) are schematic illustrations of the step-by-step fabrication of a diamond single crystal in accordance with another embodiment of the present invention.
Figure 10:
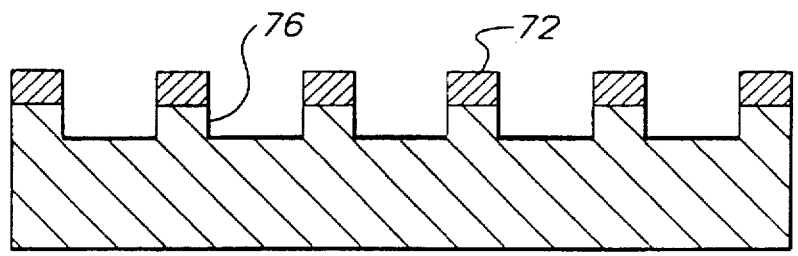

Following the precleaning step, 0.5 μm of silicon dioxide was deposited from a silicon dioxide source bombarded with argon ion beam generated from a 5 cm diameter Kaufman source at 1000 eV and 100 mA at 1×10$^{-4}$ Torr. The deposition rate of silicon dioxide was 100 Å/min. This 0.5 μm silicon dioxide layer was used as masking layer 72 in which 2 μm diameter mesas on 4 μm centers on an rectangular grid were formed by the following photolithographical procedure. After spinning positive photoresist at 5,000 rpm for 20 sec. and 90° C. bake, the photoresist layer 74 on the top of the substrate was exposed in the mask aligner with the appropriate mask for 20 sec. and developed for 40 sec. in a developer. This step formed the mesas in photoresist. Unprotected area of silicon dioxide masking layer were etched away by buffered hydrofluoric acid until the diamond surface was reached (FIG. 9). Photoresist stripper at 70° C. for 10 min. was used to remove the remainder of the photoresist 74, followed by a three times repeated rinse procedure of acetone, methanol and deionized water. The resulting patterned diamond substrate was dried in oven at 120° C. for 15 min.

In the next step, a selected depth of the unprotected diamond surface is removed by an oxygen anisotropic etching in a parallel plate reactive ion etching machine (RIE). After 30 min., 10 μm of diamond were removed from the surface by an anisotropic oxygen etching. A rectangular array of 10 μm tall mesas 76 were established by this procedure on the surface of diamond single crystal substrate. Protective cap 72 of silicon oxide on the tops of the mesas was etched away by buffered hydrofluoric acid.

Figure 11:
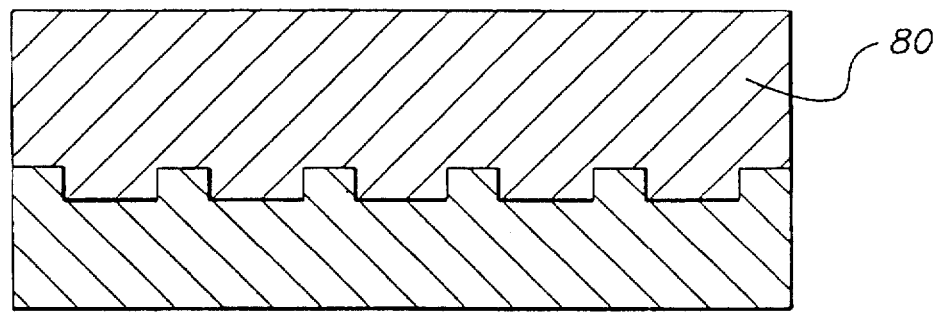
Figure 12:
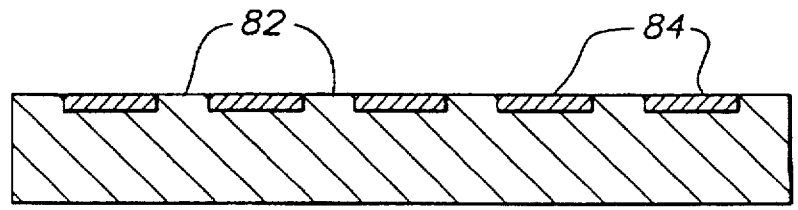

Following the removal of silicon oxide from the tops of the mesas, a protective masking layer is established in such way as to prevent diamond growth on the surface of the diamond substrate and on the diamond mesas' walls. This can be done by the number of ways and the following example demonstrate just one possible procedure. In this procedure, several applications of graphite emulsion were build up on the surface of the structure so that diamond mesas were completely covered by the graphite emulsion 80 (FIG. 11). After drying the structure in the oven at 120° C. for 30 min., the structure was planerized by polishing so that only the tops 82 of the diamond mesas were uncovered, but the rest of the nucleation structures were protected by porous, dried graphite 84 (FIG. 12). The tops of bare diamond mesas function as diamond single crystal nuclei for the initiation of diamond growth.

Figure 13:
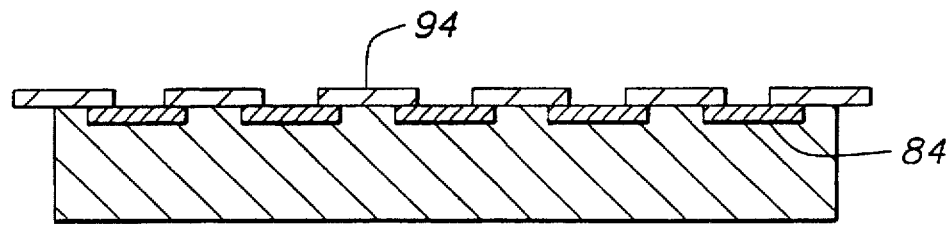
Figure 14:
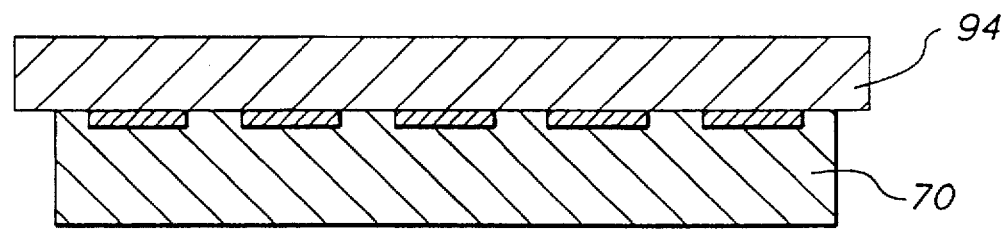

This artificial diamond nucleation structure was then placed on wafer holder in an HFCVD reactor for diamond epitaxial growth. The details of the HFCVD reactor used in this example is described in U.S. Pat. No. 5,160,544, issued Nov. 3, 1992, the details of which are incorporated by reference herein. After the distance between a carburized hot filament and the artificial nucleation structure had been adjusted to about 10 mm, the HFCVD reactor was refilled with helium and evacuated. A mixture of 1% methane and 99% of hydrogen (99.999% purity) was then admitted into the reactor at a flow rate of 10 sccm/min. and the pressure was adjusted to 30 Torr. The temperature of the patterned diamond substrate was raised to 900° C. at a rate of 100° C./min. The temperature of hot filament was maintained at about 2300° C. throughout the diamond epitaxial growth. Initial diamond nuclei 90 began to grow above the mesas as shown in FIG. 13. Epitaxial growth of diamond was carried out for 500 hours at a diamond growth rate of 0.51 μm/hour. At the termination of growth cycle, helium gas was admitted to the HFCVD reactor at 30 Torr and a flow rate of 10 sccm/min. The resulting new diamond single crystal 94 on the artificial diamond nucleation structure was cooled at a rate of 100° C./min. to room temperature. The increase in the thickness of the new composite was measured to be 250 μm, which was due to the newly grown diamond single crystal above the artificial nucleation structure (FIG. 14).

Figure 15:
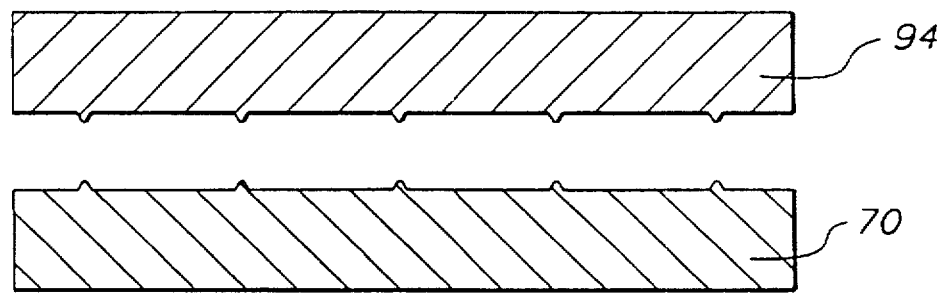

After the termination of the crystal growth cycle, the undesirable diamond growth on the sides of artificial nucleation structure was cut away with laser and the newly grown, 250 μm thick diamond single crystal 94 was then separated from the diamond substrate 70 by etching in an oxidizing atmosphere. Specifically, the composite was subjected to air at 750° C. for a sufficient period of time to etch the remainder of the graphite masking layer and etch through the 2 μm diamond mesas connecting the newly grown single crystal diamond with the original diamond substrate until separation occurred (FIG. 15).

EXAMPLE 2

MANUFACTURE OF FREE STANDING SINGLE CRYSTAL DIAMOND USING A NUCLEATION STRUCTURE HAVING INVERTED PYRAMIDAL MESA NUCLEI

A synthetic high pressure high temperature diamond single crystal square substrate of (100) orientation and 6 mm×6 mm×0.25 mm dimensions was used as a seed plate for crystal growth. The diamond seed plate was cleaned with organic solvents by rinsing 2 min. in trichloroethane, 2 min. in acetone, 2 min. in ethyl alcohol and 5 min. in deionized water, and blown dry with nitrogen gas. Next, the wafer was placed in an ion beam sputtering machine in order to deposit on its polished surface, 0.3 μm of silicon dioxide. After pulling a vacuum of $5\times10^{-6}$ Torr, the diamond substrate was precleaned with an argon ion beam generated from an 11 cm diameter Kaufman source at 500 eV and 137 mA for 1 min.

Following the precleaning step, 0.3 μm of silicon dioxide was deposited from a silicon dioxide source bombarded with argon ion beam generated from a 5 cm diameter Kaufman source at 1000 eV and 100 mA at $1\times10^{-4}$ Torr. Deposition rate of silicon dioxide was 100 Å/min. This 0.3 μm silicon dioxide layer was used as a masking layer in which 3 μm square mesas on 4 μm centers on an rectangular grid were formed by the following photolithographical procedure. After spinning positive photoresist at 5,000 rpm for 20 sec. and 90° C. bake, the photoresist layer on the top of the substrate was exposed in the mask aligner with the appropriate mask for 20 sec. and developed for 40 sec. in a developer. This step formed the mesas in the photoresist. The unprotected area of silicon dioxide masking layer was etched away by reactive ion etching until the diamond surface 10 was reached (FIG. 1). Photoresist stripper at 70° C. was used for 10 min. to remove the remainder of the photoresist, followed by a three times repeated rinse procedure of acetone, methanol and deionized water. The resulting patterned diamond substrate was dried in oven at 120° C. for 15 min.

In the next step, a selected depth of the unprotected diamond surface was removed by an oxygen anisotropic etching in a ion milling machine with a hollow cathode ion source. The oxygen ion beam was set to impinge on the plane of the substrate under 30° from the normal. The substrate was held by a holder which rotated the substrate 1 rpm. After 120 min., 6 μm of diamond were removed from the surface by an anisotropic oxygen etching. A rectangular array of 6 μm tall mesas were established by this procedure on the surface of diamond single crystal substrate (FIG. 2). The oxygen ion beam removed diamond from the bottom of the open channels so that new deeper channels are created in the underlying single crystal diamond substrate. Silicon oxide mesas were undercut under the angle of the impinging ion beam all around the silicon oxide square mesas. The shape of mesas is an inverted tetragonal pyramid where the base of the pyramid is the original square mesa on the top surface and the narrow part of the pyramid approximately 1 mm wide is connected to the diamond plate on the opposite side of the base. Protective caps of silicon oxide on the top of the mesas were etched away by buffered hydrofluoric acid (FIG. 3).

The resulting artificial single crystal diamond containing the nucleation structures exhibited precisely oriented single crystal nuclei with the density of nuclei $6.25\times10^6$ cm$^{-2}$. It was then placed on wafer holder in an HFCVD reactor for diamond epitaxial growth. The details of the HFCVD reactor used in this example was the same as that used in Example 1. After the distance between carburized hot filament and the artificial nucleation structure had been adjusted to about 10 mm, the HFCVD reactor was refilled with helium and evacuated. Mixture of 1% methane and 99% of hydrogen (99.999% purity) was then admitted into the reactor at a flow rate of 10 sccm/min. and the pressure was adjusted to 30 Torr.

The temperature of the patterned diamond substrate was raised to 900° C. at a rate of 100° C./min. The temperature of hot filament was maintained at about 2300° C. throughout the diamond epitaxial growth. Epitaxial growth of diamond was carried out for 250 hours at a diamond growth rate of 0.5 μm/hour. At the termination of growth cycle, helium gas was admitted to the HFCVD reactor at 30 Torr and a flow rate of 10 sccm/min. The resulting new diamond single crystal on the artificial diamond nucleation structures was cooled at a rate of 100° C./min. to room temperature. The increase in the thickness of the new composite was measured to be 125 μm, which was due to the newly grown diamond single crystal above the artificial nucleation structures.

After the termination of the crystal growth cycle, the newly grown 125 μm thick diamond single crystal was then laser trimmed on the edges and separated from the diamond substrate by etching in an oxidizing atmosphere. Specifically, the composite was subjected to air at 750° C. for a sufficient period of time to thin by etching the entire structure including the narrow hum part of diamond pyramidal mesas between the base and the apex until separation occurred.

Original single crystal diamond seed plate was recovered after the separation process was finished and was regrown by CVD process to the original thickness, repolished and reused again for the fabrication of an artificial diamond nucleation structure for another cycle of single crystal diamond fabrication.

EXAMPLE 3

MANUFACTURE OF A CONCAVE SINGLE CRYSTAL DIAMOND MIRROR

This example describes another technique for the manufacture of a concave single crystal diamond mirror of 5 cm diameter and 100 m focus length and 3 mm thick. At first a diamond single crystal substrate is prepared of a convex shape with its corresponding optical power by laser machining and polishing. The substrate is cleaned with organic solvents by rinsing 2 min. in trichloroethane, 2 min. in acetone, 2 min. in ethyl alcohol and 5 min. in deionized water, and blown dry with nitrogen gas.

Next, the substrate is placed in ion beam sputtering machine in order to deposit 3000° A of gold on its polished surface. The diamond substrate with the gold layer is subjected to annealing at the temperature range 800°–1000° C. for 8 hours in a closed cell. The deposition and annealing is carried out under ultrahigh vacuum. Under these conditions, the film splits up into monocrystalline gold particles approximately one mm large which are limited by facets in order to minimize the surface energy of the particles. The gold particles are separated by distance ranging approximately between one and two μm. The surface between gold particles is bare diamond suitable for etching. Individual gold particles function as a masking layer which protects the diamond from etching.

The resulting structure is then etched for one hour and half in a directional beam of oxygen ions in order to develop diamond mesas 6 mm tall. After etching away gold with aqua regia, a colloidal graphite masking layer is deposited in the etched out depressions in the diamond surface among the mesas, the surface is lightly polished to eliminate the excess of graphite and the newly formed artificial nucleation structure with non-planar surfaces is used for the growth of diamond single crystal above the nucleation structure by a CVD process. Separation of newly grown diamond single crystal is accomplished by annealing in the air at 750° C. for 5 hours in the annealing furnace.

Various other embodiments and aspects of our invention will occur to those skilled in the art without departing from the spirit or scope of the invention. Having thus described the present invention, what is now deemed appropriate for Letter Patent is set forth in the following appended claims.

What is claimed is:

1. A method for preparing seed plates for single crystal growth comprising:
    (a) depositing onto a seed plate, comprising a plurality of crystallographically oriented single crystal wafers, a masking layer including a geometric pattern in the masking layer;
    (b) selectively etching to expose the bare surface of said seed plate;
    (c) etching the exposed, geometrically patterned bare surface of said seed plate to form a plurality of nucleation structures consisting of the seed plate material and the remaining portion of said masking layer, and protruding outwardly from said seed plate; and
    (d) recovering a seed plate having a plurality of nucleation structures for single crystal growth.

2. The method of claim 1 wherein each of said plurality of nucleation structures comprises walls and a top surface having a surface area in the range of about 5 to about 90% of the surface area of the original seed.

3. The method of claim 2 wherein each of said plurality of nucleation structures comprises a protrusion mesa having walls and a top surface having a surface area in the range of about 0.2 to about 60 μm².

4. The method of claim 3 wherein step (c) is carried out so that each of said protrusion mesas are shaped into inverted pyramids; wherein any masking layer remaining after step (c) is removed from the top surface of said protrusion mesas; wherein a single crystal is grown onto the top surface of said protrusion mesas to form a continuous layer of monocrystalline material and to leave interconnecting channels within said monocrystalline material; wherein the resulting single crystal is separated from said seed plate; and wherein said single crystal having an area greater than the area of each of the individual crystal wafers is recovered.

5. The method of claim 4 wherein said single crystal has a thickness in the range of about 1 μm to 1 centimeter.

6. The method of claim 4 wherein said single crystal has a thickness in the range of about 50 μm to 1000 μm.

7. The method of claim 2 wherein said seed plate recovered from step (d) is deposited with a coating material; wherein the coating material is removed from the top surface of said nucleation structures; wherein a single crystal is grown onto the surface of said nucleation structures and the coating material to form a continuous layer of monocrystalline material; wherein the resulting single crystal is separated from said seed plate; and wherein said single crystal having an area greater than the area of each of the individual crystal wafers is recovered.

8. The method of claim 7 wherein said single crystal has a thickness in the range of about 1 μm to 1 centimeter.

9. The method of claim 2 wherein said seed plate comprises a plurality of oriented single crystal diamond wafers.

10. The method of claim 9 wherein said seed plate recovered from step (d) is deposited with a coating material; wherein the coating material is removed from the top surface of said nucleation structures; wherein diamond is grown onto the surface of said nucleation structures and the masking layer to form single crystal diamond; wherein the resulting single crystal diamond is separated from said seed plate; and wherein said single crystal diamond having an area greater than the area of each of the individual single crystal diamond wafers is recovered.

11. The method of claim 9 wherein step (c) is carried out so that each of said protrusion mesas are shaped into inverted pyramids; wherein any masking layer remaining after step (c) is removed from the top surface of said protrusion mesas; wherein a diamond is grown onto the top surface of said protrusion mesas to form a continuous layer of single crystal diamond and to leave interconnecting channels within said single crystal diamond; wherein the resulting single crystal diamond is separated from said seed plate; and wherein said single crystal diamond having an area greater than the area of each of the individual crystal wafers is recovered.

12. A method for single crystal growth by chemical vapor deposition comprising:
   (a) depositing onto a seed plate, comprising a plurality of oriented crystal wafers, a masking layer including a geometric pattern in the masking layer;
   (b) selectively etching to expose the bare surface of said seed plate;
   (c) etching the exposed, geometrically patterned bare surface of said seed plate to form a plurality of nucleation structures consisting of the seed plate material and the remaining portion of said masking layer, and protruding outwardly from said seed plate, each of said protrusion structures having substantially straight side walls and a top surface having a surface area in the range of about 0.2 to about 60 $\mu m^2$;
   (d) removing the remainder of said masking layer;
   (e) depositing a layer of a coating material having a thickness in the range of about 5 to about 30 $\mu m$ onto said seed plate;
   (f) planarizing the coated seed plate to expose the top surface of said mesas;
   (g) placing said seed plate into a chemical vapor deposition reactor;
   (h) growing a single crystal on the top surface of said protrusion mesas and laterally over the coating material layer to form a continuous layer of monocrystalline material;
   (i) separating the resulting single crystal from said seed plate; and
   (j) recovering said single crystal having an area greater than the area of each of the individual crystal wafers.

13. The method of claim 12 wherein said single crystal according to step (j) is used as said seed plate in place of the plurality of oriented crystal wafers.

14. The method of claim 12 wherein said single crystal is selected from the group consisting of diamond, boron nitride and silicon carbide.

15. The method of claim 14 wherein said single crystal is chemical vapor deposited at temperatures in the range of about 350° to about 1250° C.

16. The method of claim 12 wherein said crystal wafer is selected from the group consisting of diamond, boron nitride and silicon carbide.

17. The method of claim 12 wherein the thickness of said epitaxially grown crystal layer is in the range of about 1 $\mu m$ to about 1 centimeter.

18. The method of claim 12 wherein the thickness of said single crystal is in the range of about 50 $\mu m$ to about 1000 $\mu m$.

19. The method of claim 12 wherein the composition of said masking layer comprises a material selected from the group consisting of silicon, tungsten, molybdenum, nickel, gold, copper, soft carbon, diamond-like carbon, hydrogenated diamond-like carbon, graphite, $SiO_2$, $Si_3N_4$, MgO, CaO, and silicon oxynitride.

20. The method of claim 19 wherein said coating material is selected from the group consisting of soft carbon, carbon soot, graphite, diamond-like carbon, hydrogenated diamond-like carbon, graphite, submicron-sized metal powder, aliphatic epoxy polymers and mixtures thereof.

21. The method of claim 12 wherein said single crystal is separated from said seed plate and the resulting separated seed plate is reused in the production of larger single crystals.

22. A method for single crystal growth by chemical vapor deposition comprising:
   (a) depositing onto a seed plate, comprising a plurality of oriented crystal wafers, a masking layer including a geometric pattern in the masking layer;
   (b) selectively etching to expose the bare surface of said seed plate;
   (c) etching the exposed, geometrically patterned bare surface of said seed plate to form a plurality of nucleation structures consisting of the seed plate material and the remaining portion of said masking layer, and protruding outwardly from said seed plate, each of said protrusion structures in the shape of inverted pyramidal mesas having side walls and a top surface having a surface area in the range of about 0.2 to about 60 $\mu m^2$;
   (d) removing the remainder of said masking layer;
   (e) placing said seed plate into a chemical vapor deposition reactor;
   (f) growing a single crystal onto top surface of said inverted pyramidal mesas to form a continuous layer of monocrystalline material and to leave interconnecting channels within said monocrystalline material;
   (g) separating the resulting single crystal from said seed plate; and
   (h) recovering said single crystal having an area greater than the area of each of the individual crystal wafers.

23. The method of claim 22 wherein said single crystal according to step (h) is used as said seed plate in place of the plurality of oriented crystal wafers.

24. The method of claim 22 wherein said single crystal is selected from the group consisting of diamond, boron nitride and silicon carbide.

25. The method of claim 22 wherein said seed wafer is selected from the group consisting of diamond, boron nitride and silicon carbide.

26. The method of claim 22 wherein the thickness of said epitaxially grown crystal layer is in the range of about 1 $\mu m$ to about 1 centimeter.

27. The method of claim 22 wherein the thickness of said epitaxially grown crystal layer is in the range of about 50 $\mu m$ to about 1000 $\mu m$.

28. The method of claim 23 wherein said single crystal diamond is chemical vapor deposited at temperatures in the range of about 350° to about 1250° C.

29. The method of claim 22 wherein the composition of said masking layer comprises a material selected from the group consisting of silicon, tungsten, molybdenum, nickel, gold, copper, soft carbon, diamond-like carbon, hydrogenated diamond-like carbon, $SiO_2$, $Si_3N_4$, MgO, CaO, and silicon oxynitride.

30. The method of claim 29 wherein said single crystal is separated from said seed plate and the resulting separated seed plate is reused in the production of large single crystals.

* * * * *